(12) United States Patent
Cominetti et al.

(10) Patent No.: US 8,263,293 B2
(45) Date of Patent: Sep. 11, 2012

(54) TRIDIMENSIONAL STRUCTURES FOR AN INK JET PRINTHEAD AND RELEVANT MANUFACTURING PROCESS

(75) Inventors: Fulvio Cominetti, Arnad (IT); Luigina Gino, Arnad (IT)

(73) Assignee: Telecom Italia S.p.A., Milan (IT)

( * ) Notice: Subject to any disclaimer, the term of this patent is extended or adjusted under 35 U.S.C. 154(b) by 1392 days.

(21) Appl. No.: 11/793,756

(22) PCT Filed: Dec. 22, 2004

(86) PCT No.: PCT/IT2004/000718
§ 371 (c)(1),
(2), (4) Date: Jun. 21, 2007

(87) PCT Pub. No.: WO2006/067814
PCT Pub. Date: Jun. 29, 2006

(65) Prior Publication Data
US 2008/0113277 A1    May 15, 2008

(51) Int. Cl.
*G03F 1/00* (2012.01)
(52) U.S. Cl. .............................. 430/5; 430/311
(58) Field of Classification Search ................... 430/5
See application file for complete search history.

(56) References Cited

U.S. PATENT DOCUMENTS

| | | | |
|---|---|---|---|
| 5,683,856 A | 11/1997 | Aoai et al. | |
| 5,981,139 A | 11/1999 | Tomo et al. | |
| 6,123,863 A | 9/2000 | Shimomura et al. | |
| 6,753,128 B2 | 6/2004 | Lee et al. | |
| 6,858,379 B2 * | 2/2005 | Zampini et al. | 430/325 |
| 7,186,773 B2 * | 3/2007 | Araki et al. | 524/553 |
| 7,335,463 B2 * | 2/2008 | Rosa et al. | 430/320 |
| 2003/0082481 A1 | 5/2003 | Lee et al. | |
| 2003/0087199 A1 * | 5/2003 | Kim et al. | 430/320 |

(Continued)

FOREIGN PATENT DOCUMENTS

| | | |
|---|---|---|
| EP | 0 881 540 A | 12/1998 |
| EP | 1 253 138 A | 10/2002 |
| JP | 2000 275835 A | 10/2000 |
| WO | WO-2005/052688 | * 6/2005 |

OTHER PUBLICATIONS

Yun-Ju Chuang et al , "A novel fabrication method of embedded micro-channels by using SU-8 thick-film photoresists" The Institution of Electrical Engineers, vol. 3, No. 1-2, XP004400381, 2003.

(Continued)

*Primary Examiner* — Cynthia Kelly
*Assistant Examiner* — Anna Verderame
(74) *Attorney, Agent, or Firm* — Venable LLP; Robert Kinberg; Steven J. Schwarz

(57) ABSTRACT

In a monolithic ink jet printhead, a structural layer is made comprising cavities, obtained from the polymerization of a solution of a monomer, or an oligomer, and a photoinitiator; during the polymerization by radiation, acid species are unduly generated in zones protected by a mask, due to reflection of the radiation on reflecting surfaces of the support of the sructural layer; these acid species cause undue polymerization of the solution on the inside of the cavities to oppose the formation of these acid species, a polymerzation inhibitor basic compound is used.

12 Claims, 9 Drawing Sheets

U.S. PATENT DOCUMENTS

2003/0087202 A1* 5/2003 Lin .............................. 430/329
2003/0099901 A1* 5/2003 Hatakeyama et al. ..... 430/270.1
2003/0232270 A1* 12/2003 Chen et al. ................... 430/170

OTHER PUBLICATIONS

F.G. Tseng et al., "A novel fabrication method of embedded micro channels employing simple UV dosage control and antireflection coating" Technical Digest. Mems 2002 IEEE International Conference. Fifteenth IEEE International Conference on Micro Electro Mechanical Systems, pp. 69-72, XP002354591, 2002.

M-S Chen et al., "Additive channel-constrained metallization of high-resolution features", vol. 379, No. 1-2, XP004226564, 2000.

International Search Report, Dated Nov. 17, 2005, Issued is Appln. PCT/IT2004/000718.

* cited by examiner

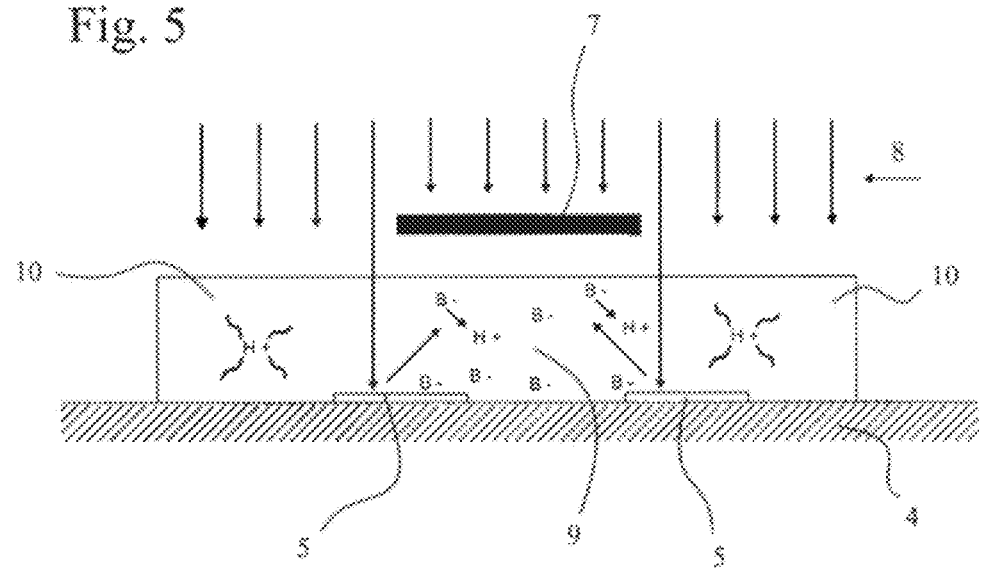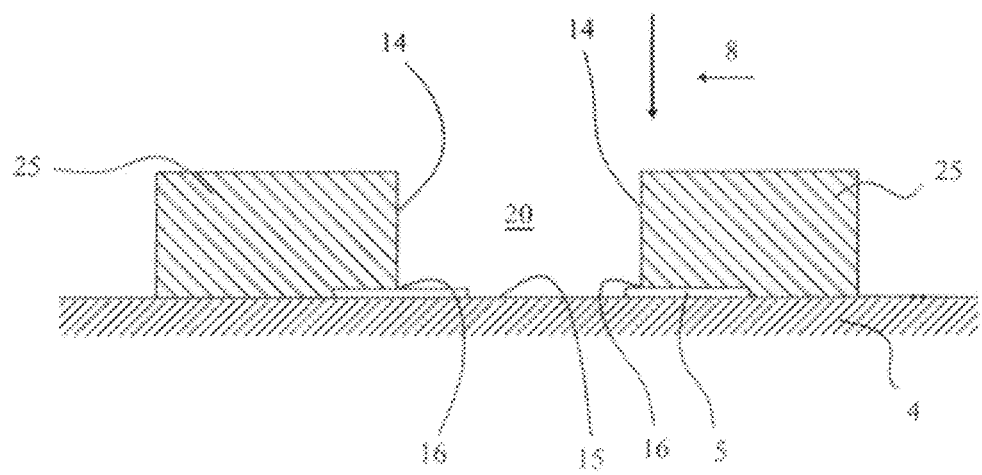

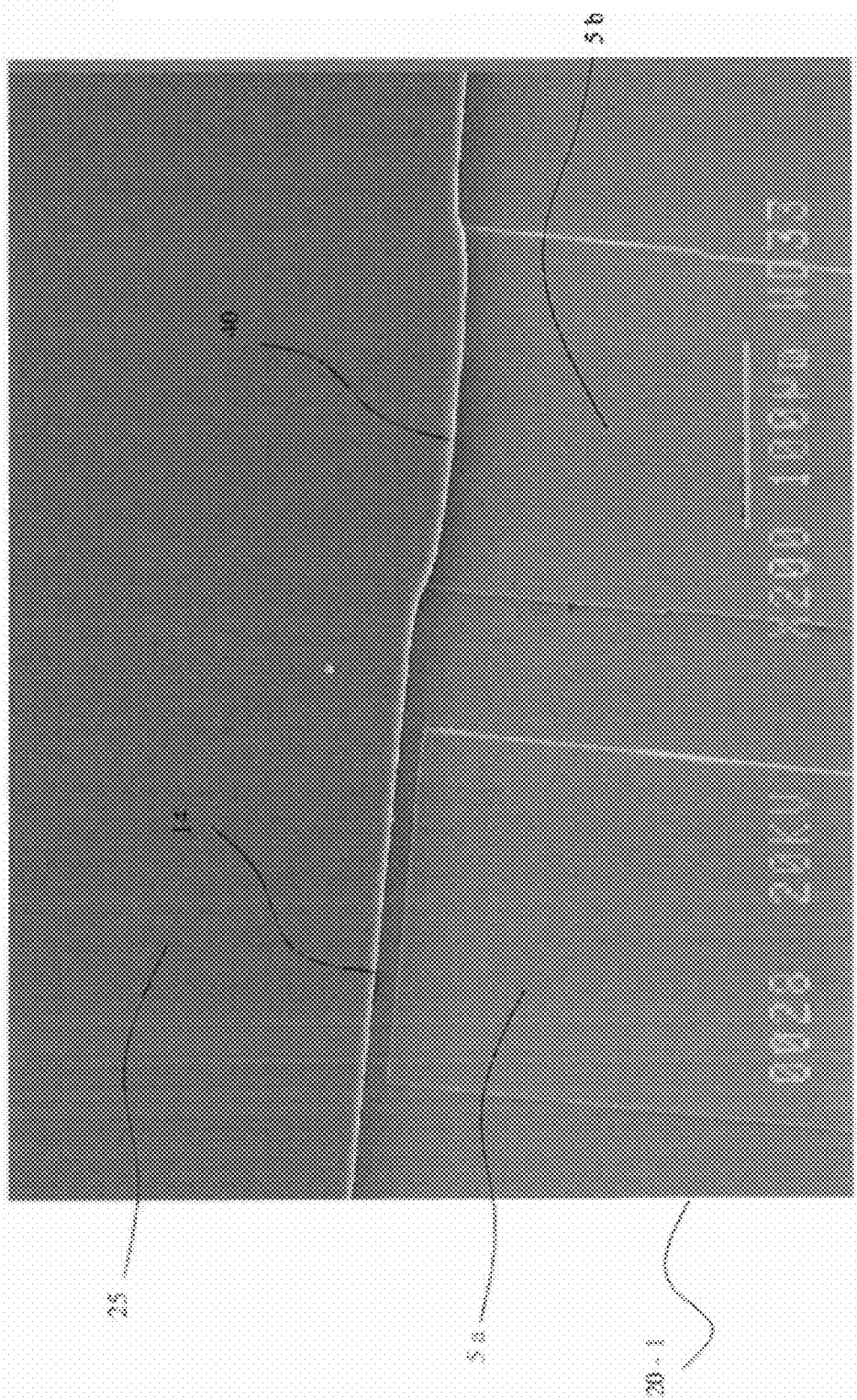

TRIDIMENSIONAL STRUCTURES FOR AN INK JET PRINTHEAD AND RELEVANT MANUFACTURING PROCESS

BACKGROUND OF THE INVENTION

This invention relates to tridimensional structures, used in an ink jet printhead and the relevant manufacturing process.

In particular the printhead that this invention relates to, is of the type in which ink droplets are ejected through an ejection duct, or nozzle, communicating with a vaporisation chamber, in which a bubble of vapour is produced.

BRIEF DESCRIPTION OF THE STATE OF THE ART

Ink jet printheads are known in the art, in which the energy for expelling the drops of ink is obtained from the vaporisation of a small volume of ink contained in the vaporisation chambers, which is expelled through the nozzles communicating with these chambers.

Vaporisation of the ink is caused by a resistor placed within the chambers and suitably energized by means of electronic microcircuits. The ink is supplied through a feeding duct which is in communication with both the chamber, and also with a slot, made in the thickness of a silicon die.

The term "microhydraulics" is understood to mean as a whole the nozzles, the vaporisation chambers and the ink feeding ducts connected to them.

Similarly the term "microelectronics" is understood to mean as a whole the active and passive electronic components, produced by means of photolithography on the silicon die.

Ink jet heads, called monolithic, have their microhydraulics made in a single layer of material, called the structural layer. This can be done by making templates of the hydraulic microcircuit with a sacrificial layer, depositing a solution of photosensitive material on it, polymerizing it and finally removing the sacrificial layer.

The structure of a monolithic head is illustrated in FIG. 1 by means of an axonometric projection sectioned parallel to the x-z axis; depicted in the figure are:

The silicon die 4, on which the head itself is built;
The structural layer 25;
The vaporisation chambers, or simply chambers, 26, made in the structural layer 25; the figure shows only one of the chambers 26, in cross-section;
The nozzles 24, one of which shown in cross-section, made on the top of the chambers 26;
The slot 27 and the ducts 22, made in the die 4 and shown in cross-section in the figure, which convey the ink to the chambers 26;
Electric contacts or "pads" 23;
apertures 12 in correspondence with the pads 23, made in the structural layer.

The microelectronics are built on the upper face of the silicon die 4, and are not visible in FIG. 1 as they are hidden by the structural layer 25.

The pads 23 have the function of electrically connecting the microelectronics with the circuits external to the head, through contact with special external conductors called "fingers". The fingers and the microelectronics are not depicted in any figures as they are not essential for an understanding of the invention.

Ink jet heads having for example 300 nozzles, a definition for example of 600 dots per inch (dpi), and suitable for emitting drops of volume 5 pl for example, have chambers with dimensions in the order of tens of µm (for instance, they have side of about 20 µm and thickness about 10 µm), with tolerances in the order of a µm.

The apertures 12, leaving the pads uncovered, allow these to come into electrical contact with the fingers. The apertures have dimensions in the order of tens or hundreds of µm (for instance, they have side of about 100 µm with tolerances in the order of a µm) and are typically of the same height as the chambers.

The microelectronics underneath are, on the other hand, made from elements whose dimensions are in the order of a µm, meaning therefore that they are typically smaller than the elements of the microhydraulics by two orders of magnitude.

During production of the various layers of the microelectronics, layers of polymerizable materials are used for the purpose of selectively protecting certain portions of the die being worked on, intended to be removed later. These layers are substantially different from the structural layer that makes up the microhydraulics, in particular they typically have a thickness in the order of a µm or less and, as they are intended to be removed in later work phases, are made of materials of low mechanical characteristics and adhesion to the adjacent layers.

To guarantee high reliability of the head, it is recommended that the structural layer 25 displays excellent chemical inertness in respect of the ink, for instance even when the ink, for reasons linked to the stability of the raw materials used to manufacture it, has high alkalinity values. The structural layer should conveniently also have a sufficient mechanical resistance and optimal adhesion to the substrate, even if remaining constantly in contact with the ink.

The U.S. Pat. No. 6,123,863 describes a process for the production of an ink jet printhead comprising the phases of producing, in a sacrificial layer of positive resist deposited on the silicon substrate, the templates of the hydraulic microcircuits, covering the sacrificial layer with a structural layer made, inter alia, from a preparation based on photopolymerizable epoxy resin cycloaliphatic (EHPE 3150 Daicel), and after polymerization of the structural layer, removing the sacrificial layer with one or more solvents belonging to the family of aliphatic esters of lactic acid chosen from methyl lactate, ethyl lactate and butyl lactate.

In the context of the technology for forming ultrafine structures in the manufacture of semiconductors, U.S. Pat. No. 6,753,128 proposes a photosensitive solution made up of a photopolymer, a photoinitiator and a basic additive suitable for neutralizing the acid species that have migrated, or spread into unexposed areas.

The basic additive is made up of basic compounds with a fluorendiamine and naftalendiamine structure, with high degree of basicity, as the coefficient of acidity of the conjugate acid (pKa) is between 12 and 16.

The basic additive is present in the photopolymerizable solution in an amount that is between 0.5% and 20% in weight of the photoinitiator. The results give a value for LER (Line Edge Roughness) of 9-13 nm, in comparison with a LER value of 10-20 nm obtained in the absence of the proposed additive.

U.S. Pat. No. 5,683,856 describes a process intended to improve the definition of ultrafine structures made in a polymerized layer, by eliminating the imperfections caused by a migration of acid species into areas not exposed to radiation, or by basic impurities present in the atmosphere, which alter the concentration of the acid species on the surface of the photopolymer. It proposes a photosensitive composition with positive action comprising a photoinitiator, a component inhibiting dissolution of the polymer and a basic species made up of polymers containing nitrogen. The results refer to a resolution, in the structures made in this way, of between 260 and 480 nm, indicated as difficult to obtain without the additive proposed.

U.S. Pat. No. 5,981,139 refers to the production of structures in a photopolymer, comprising a photosensitive compound of the chemical amplification type, containing a generator of photosensitive acid species; when this photopolymer is used in the presence of basic environmental contaminants, such as for instance, ammoniacal gases, or in contact with an isolating layer of silicon nitride, impregnated with ammonia or water, or again in contact with layers of a phosphorous and boron based glass, deactivation of part of the acid species may be observed. As a result, irregularly-shaped structures are formed, for instance with rounded corners, or with polymer residues.

To avoid these imperfections the patent quoted proposes mixing a special type of aliphatic amine, or one of its salts, with the photopolymer, in a quantity less than 1% in weight.

The European patent application EP 1 253 138 relates to the problem of eliminating, as in those quoted previously, the geometric deformations of tridimensional ultrafine structures having resolution of 200 nm or less, caused by the presence of basic contaminant components present in the air, which neutralize the acid species of the photopolymer; for this purpose, the above-mentioned European patent application EP 1 253 138 proposes using, as additives to the chemical amplification photopolymer, basic compounds consisting of tertiary amines containing an ester group.

The applicant observes that the above-mentioned patents relate to the technology of integrated circuits having patterns in the order of a micron, and tackle the problem of eliminating irregularities typically less than a micron (LER between 10 and 20 nm, for example).

Conversely, the structures of the microhydraulics relative to this invention have typical dimensions of tens or hundreds of μm, with tolerances in the order of the μm. These are not therefore affected by the problems tackled by the above-mentioned patents, as the tolerances are wider than the defects that these patents propose eliminating.

SUMMARY DESCRIPTION OF THE INVENTION

In connection with this invention the inventors have observed in any event that, though a preparation based on a cycloaliphatic epoxy resin permits good adhesion to the substrate to be obtained on account of the low volume shrinkage and has good characteristics of chemical inertness in relation to the ink, important residues still remain of material undesirably polymerized during the photolithographic process employed to make the tridimensional structures, in particular during the chemical etching process intended to selectively remove the masked and therefore unpolymerized areas of the layer. These residues are indicated with the numeral 40 in the photo of FIG. 2, obtained by means of an electron scan microscope.

Details are provided below of the composition and preparation of the polymerizable mix, together with the conditions under which the photolithographic process is conducted, in which the specimen of the photo of FIG. 2 was obtained, with reference to the description of example no. 1.

The photo depicts a cavity 20, suitable for constituting, for instance, an aperture 12, and having dimensions of several hundreds of μm, as shown from the dimensional scale included in the picture. On the bottom wall 15 of the cavity is a metallic part 36 also having dimensions in the order of hundreds of μm, suitable for constituting, for instance, a pad or an electric conductor. The residues 40 have dimensions between, for instance, a few tens and a few hundreds of a μm, they therefore concern a large part of the area of the cavity 20 and of the metallic part 36, and generate drawbacks in the subsequent head assembly processes, drastically reducing the yields and increasing the production cost: if for example, the metallic part 36 were to be a pad, the residues 40 could prevent an effective electrical contact from being established with the relative finger, meaning that the head in question would be rejected.

Not wanting to be bound to one theory, the inventors believe that the phenomenon of unwanted polymerization observed in the areas not exposed to radiation is due to the generation of acid species due to reflection of the radiation on reflecting portions of the bottom wall of the tridimensional structures in the areas underneath the mask, and not to migration of the acid species generated during the exposure. This unwanted polymerization extends over tens or even hundreds of μm, as already observed in the photo of FIG. 2.

In the documents quoted earlier, the problem of diffusion of the acid species in the technology of ultrafine integrated circuit structures concerns dimensions of the order of a tens of nanometers, i.e. about two orders of magnitude less than the desired tolerances in microhydraulics of the heads, and from three to four orders of magnitude less than the dimensions of the residues observed by the inventors.

In this description, the term "acid species" is taken to mean hydrogen ions or groups likely to promote the polymerization of cationic polymerization monomers or oligomers.

In view of this, according to this invention it was found that it was possible to obtain tridimensional structures in a polymerizable material by photochemical means, free of residues even in the presence of substrates at least in part reflecting, provided that effective opposition is provided to the undesired polymerization of the photosensitive mix due to the generation of acid species in the areas not exposed to radiation.

In particular, the inventors believed that this phenomenon of undesired polymerization was caused by the reflection of the radiation striking surfaces of any shape and extent, and typically takes place when the surfaces reflect a percentage of incident radiation between 50 and 95%, and more specifically at least equal to 70%.

In the context of this invention the applicant has therefore noted that the problem of the presence of defects in the walls of the structural layers in heads for ink jet printing, was due to reflectivity of the substrate on which said structural layer was made, and which could therefore be resolved by controlling the polymerization in the areas protected by masking, in particular through the use of a controlled quantity of the polymerization inhibitor in said structural layer, said quantity being insufficient to prevent polymerization in the areas subjected to direct radiation, but sufficient to ward off polymerization in the areas exposed to reflection.

For simplicity's sake, in the description that follows, the terms reflect, reflection and derivatives are used also with the meaning of diffuse, diffusion and derivatives.

In particular, the method of producing tridimensional structures for an ink jet printhead, according to the invention, makes use of a polymeric structural layer obtained from a photosensitive mix containing at least one monomer or one epoxy oligomer, a photoinitiator capable of generating Lewis acids when struck by UV radiation, and a basic polymerization inhibitor compound, mixed in a measure at least sufficient to neutralize the acid species unduly generated in the areas not exposed to direct radiation, on account of reflection of the radiation on reflecting portions of the support surface.

At the same time, the inhibitor compound must be mixed in sufficiently low measure to be fully consumed in the areas exposed to direct radiation, and thus allow polymerization of the structural layer in these areas.

In a first aspect, this invention relates to a photolithographic process for making tridimensional structures in a structural layer in photopolymer for an ink jet printhead. The tridimensional structures are made on a substrate having a bottom wall at least in part reflecting, and comprise at least one side wall adjacent to said bottom wall. The process comprises the operations of:

depositing on the substrate a photopolymerizable layer comprising a solution of a monomer or oligomer, a photoinitiator, and a polymerization inhibitor basic compound in a quantity less than the stechiometric value corresponding to complete neutralization of the acid species generated by the photoinitiator;

masking the photopolymerizable layer to define areas protected and areas not protected by the masking, intended to produce the tridimensional structures;

irradiating with ultraviolet radiation (UV) to generate acid species suitable for promoting polymerization of the solution in the areas not protected by the masking, while a fraction of the radiation is reflected by the reflecting part on the inside of the areas protected by the masking and generates unwanted acid species;

neutralizing the unwanted acid species by means of the inhibitor basic compound;

removing the unpolymerized part of the photopolymerizable solution from the areas protected by the masking.

Preferably, the polymerization inhibitor is chosen from: N,N-dimethylaniline; piridine; hydroxylamina; 2,6-dimethylpiridine; 4-dimethylamminopiridine; imidazole; morpholine; hydrazine; piperidine; triisopropanolammina; methylamine; ethylamine; diethylamine; triethylamine.

Alternatively, the polymerization inhibitor comprises tris-(2-hydroxy-1-propyl)ammina, or piperidine, or 4-dimethylamminopiridine.

Preferably, the polymerization inhibitor has a coefficient of acidity of the conjugate acid (pKa) of between 5 and 11, and is present in said polymerizable solution with a concentration between 0.05% and 0.4% by weight, with respect to the weight of the polymerizable solution, excluding the solvent.

Preferably, the stechiometric ratio of the polymerization inhibitor with respect to the photoinitiator is between 1:10 and 9:10, and more preferably between 1:8 and 3:8.

In particular, the reflecting part of the bottom wall of the substrate is made of a track of Aluminium.

Preferably, the tridimensional structures comprise at least one cavity of side at least 20 μm, having a bottom wall that comprises a reflecting portion, and the tridimensional structures have a thickness of at least 5 μm.

In a second aspect, this invention relates to an ink jet printhead produced by means of the process described above.

These and other characteristics of the invention will appear more clearly from the following description of a preferred embodiment, provided by way of non-restrictive example, with reference to the accompanying drawings.

BRIEF DESCRIPTION OF THE DRAWINGS

FIGS. 3, 4, 5 and 6 represent in schematic form how the inhibition action is carried out according to the invention;

FIG. 7 is a microphotograph of a tridimensional structure made according to a method known in the prior art;

DESCRIPTION OF A PREFERRED EMBODIMENT

The inventors noted that the phenomenon whereby a certain amount of acid species is present unwanted in the areas not exposed to polymerizing radiation, occurs significantly in the production of hollow tridimensional structures when the substrate on which these structures have to be made is reflecting type, where by reflecting surface is meant a surface made of a material that reflects roughly between 50% and 95% (or more) of the incident radiation and more specifically at least about 70% of said incident radiation.

The inventors saw that the reflection of the radiation on reflecting portions of the bottom wall of the tridimensional structures produces a polymerization of the photopolymerizable solution, including in areas protected by the mask, independently of the presence of migration of acid species, or of the presence of external impurities in the photopolymerizable solution employed. It was in fact noted that the unwanted polymerization does not occur when the bottom wall has reflectance less than approximately 50%, for example in the areas in which the structural layer is deposited directly on top of a substrate of silicon carbide, without further metallic layers.

The silicon, which has low reflectivity, is considered a nonmetal for the purposes of this description.

According to this invention, in order to avoid the above-described unwanted polymerization, a polymerization inhibitor basic additive is mixed with the photopolymerizable solution used in production of the structural layer.

The process of producing tridimensional structures, according to the invention, and the method of acting of the polymerization inhibitor basic additive is described with reference to the FIGS. 3-6.

Figure 3:
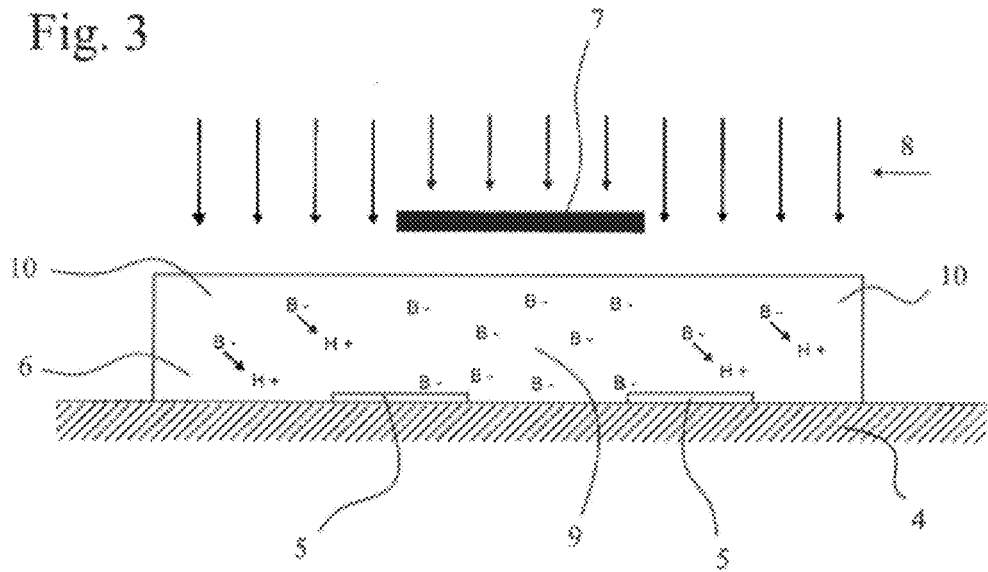
Figure 4:
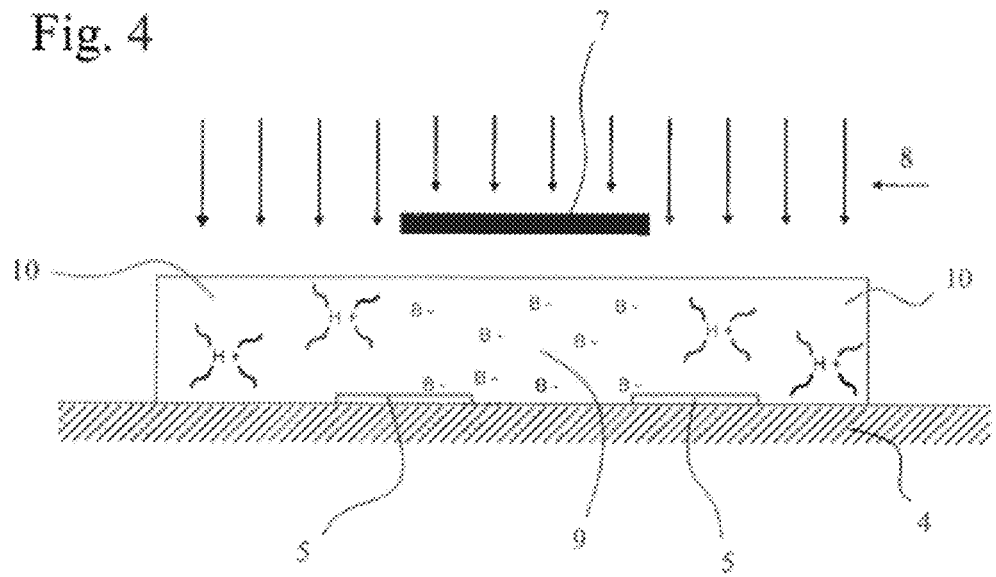

FIGS. 3-5 represent, schematically and not to scale, the die 4 comprising at least one reflecting portion 5; on the die 4 a layer 6 is deposited of a photopolymerizable solution containing a polymerization inhibitor basic additive.

A mask 7, opaque to the radiation 8, covers a zone 9 and leaves uncovered surrounding zones 10. The layer 6 comprises B− basic species, consisting of a polymerization inhibitor basic additive, added to the polymerizable solution of the layer 6.

During a first part of the exposure, H+ acid species are generated in the layer 6 in the zones 10 exposed to the radiation 8; these acid species are quickly neutralized by the basic inhibitor, so that polymerization does not start; however, the inhibitor present in the exposed zones 10 is rapidly depleted and at a certain point (FIG. 4) all the inhibitor will have disappeared, whereas in the zones 9 not exposed, under the mask 7, it is still present and active.

As the radiation continues, polymerization starts in the exposed zones 10, with the generation of new acid species.

Through the effect of the reflections on the reflecting surface 5 on the chip 4 (FIG. 5), acid species are also generated under the mask 7, in the zones not exposed 9, but are immediately neutralized by the inhibitor still present in the zone under the mask, and therefore no form of polymerization can start up in the zone 9.

When, in the successive phases of the process not depicted for simplicity's sake, the layer 6 is developed with appropriate solvents, the zone 9 of the layer 6 which was under the mask 7, as it is not polymerized, is totally removed.

A structural layer 25 is thus made, in the present case comprising a cavity 20 (FIG. 6), which is bounded by substantially flat lateral walls 14 (or at any rate with rectilinear generatrices), arranged parallel to the direction of the radiation 8, and joined at a right angle to the bottom wall 15 of the chip 4 with sharp edges 16.

A photopolymerizable solution, according to the invention, consists of an epoxy monomer or oligomer, preferably cycloaliphatic type, such as for example 3,4-epoxycyclohexyl-methyl-3,4-epoxycyclohexane carboxylate (of the type CYRACURE UVR-6105, UV-6107 and UV-6110—DOW CHEMICAL Co), bis-(3,4-epoxycyclohexylmethyl) adipate (such as Cyracure UVR 6128—Dow Chemical Co.) and the product obtained from condensation of 1,2-epoxy-4-(2-ossiranil)cyclohexane with 2,2'-bis(hydroxymethyl)-1-butanol better known by its commercial name of EHPE-3150 (Daicel Chemical Industries); a cationic photoinitiator, i.e. capable of generating acid species when irradiated with appropriate radiation. Among the cationic photoinitiators that may be used for the purpose, there are the onium salts, such as arylsolfonium salts and aryliodonium salts, where the counter-ion may be the hexafluoroantimonate anion or the hexafluorophosphate anion.

Particularly preferred for its high level of reactivity is the mix of bis(4-(diphenylsolfonium)phenyl)sulphide bis(hexafluoroantimonate) and diphenyl((phenylthio)phenyl) solfonium hexafluoroantimonate, better known by its commercial name of Cyracure UVI-6976. In addition to the epoxy compound and the cationic photoinitiator, the following may also be present in the mix: reticulating additives, to increase the percentage of conversion of the epoxy rings and make the layer obtained more chemically inert, such as aliphatic, cycloaliphatic and aromatic dioles and trioles, of the trimethylolpropane type, ε-caprolactone-triole, 1,4-bis(2-hydroxyhexafluoropropyl)benzene; wetting agents to enhance uniformity of application of the photosensitive mix on the substrate, such as silicon additives, of the type Dow Corning 57 (Dow Corning Co.); an adhesion promoter, to improve the adherence of the structural layer to the inorganic substrate, chosen in function of the type of inorganic substrate being used.

In particular, for a silicon substrate, or a compound of silicon such as for example silicon carbide, oxide or nitride, or of metals that react easily with oxygen, adhesion promoters belonging to the family of silanes are particularly recommended, and more specifically for the purposes of this invention, compounds belonging to the family of functionalized epoxy silanes, such as (3-glicidossi)-trimetoxyisilane.

The photopolymerizable mix may also contain an organic solvent, to regulate viscosity and facilitate deposition on the substrate, through application processes such as spray application, metallic blade application, and spinner application (preferred in the photoresist technique).

The solvent is chosen from among those compatible with the components, the mix and in function of the chosen application process. In particular, for application with a spinner, the solvent must preferably have a vapour pressure such as to avoid it evaporating too quickly at ambient temperature: particularly recommended for the purpose are the solvents with a vapour pressure at 20° C. of less than 20 kPa and preferably of less than 5 kPa.

According to the invention, for the purpose of avoiding unwanted polymerizations of non-irradiated areas present on reflecting substrates, to the photopolymerizable mix described above a basic additive, polymerization inhibitor is added, preferably chosen from among N,N-dimethylaniline; piridine; hydroxylamina; 2,6-dimethylpiridine; imidazole; tris-(2-hydroxy-1-propyl)amine; hydrazine; 4-dimethylamminopiridine; morpholine; methylamine; ethylamine; diethylamine; triethylamine; piperidine.

Conveniently, the basic additive should respect a number of conditions, in order to obtain the best results in manufacturing tridimensional structures, free of geometrical irregularities; in particular:

a) the basic additive should be substantially soluble in the composition described, and in general, in organic solvents if present;

b) the coefficient of acidity of the conjugate acid (pKa) pf the basic additive should preferably be between 5 and 11;

c) the basic additive should be provided with a low mobility in the polymerizable solution, to avoid it from migrating, in the course of the polymerization process, from the zones not exposed to radiation to those that are exposed;

d) the quantity of basic additive included in the photopolymerizable solution must be stechiometrically less than that of the photoinitiator, in such a way that the additive is sufficient to neutralize the acid species generated by the reflected radiation in the zones that are not exposed, but is such as to allow in any case acid species to survive in the exposed zones sufficient to promote polymerization.

In particular, the stechiometric ratio of the additive with respect to the photoinitiator is preferably between 1:20 and 19:20 and more preferably between 1:10 and 9:10.

In addition, the concentration by weight of the additive with respect to the weight of the solution, solvent excluded, is preferably between 0.05% and 0.4%.

More in general, the organic bases, such as the primary amines, the secondary amines and preferably the tertiary amines have been found to be suitable for use in accordance with the invention, as polymerization inhibitor additives, unlike the inorganic bases, such metallic hydroxides and ammonia.

EXAMPLE 1

This example has been produced without the addition of the basic additive, and is given here for comparison with the examples from 3 to 6, in which the basic additive was added.

In a glass container, 81 p/p of the oligomer cycloaliphatic epoxide produced from the condensation of 1,2-epoxy-4-(2-ossiranil)-cyclohexane and 2,2'-bis(hydroxymethyl)-1-butanol, 3.5 p/p of the cationic photoinitiator an equimolar mix between bis(4-(diphenylsolfonium)phenyl)sulphide, bis(hexafluoroantimonate) and diphenyl((phenylthio)phenyl) solfonium hexafluoroantimonate, and 15.5 p/p of the chain transfer agent 1,4-bis(2-hydroxyesafluoropropyl)benzene were mixed in bis(2-methoxyethyl)ether.

Also added to the mix were 8 p/p of 3-glycidoxy-trimetoxysilane and 0.002 p/p of the Dow Corning siliconic additive no. 57 (Dow Corning Co.).

Mixing of the components was produced by rotation in a trundler for 24 h.

The mix described above was applied to a substrate of silicon carbide that had a zone provided with a metallic coating, consisting of a layer of aluminium, by means of spin coating for 20 seconds at 2000 revs/min, giving a layer 25 μm thick.

The substrate with the mix deposited was radiated with UV radiation produced by a mercury vapour lamp, with a suitable mask placed in between to define a pattern including a cavity. A total energy of 2.5 J/cm² was radiated on the specimen.

The reflectivity of the substrate in the areas of the metallic coatings was estimated at roughly 70-80%, whereas the reflectivity of the substrate in the zones without metallic coatings was evaluated at less than 40%.

At the end of the exposure, the non polymerized parts were removed by immersion for 3 minutes in a 1/1 p/p mix of xylene and methylisobutylchetone.

The definition of the pattern obtained and the presence or otherwise of undesired residues was evaluated by observation under an electronic scanning microscope (SEM).

Figure 1:
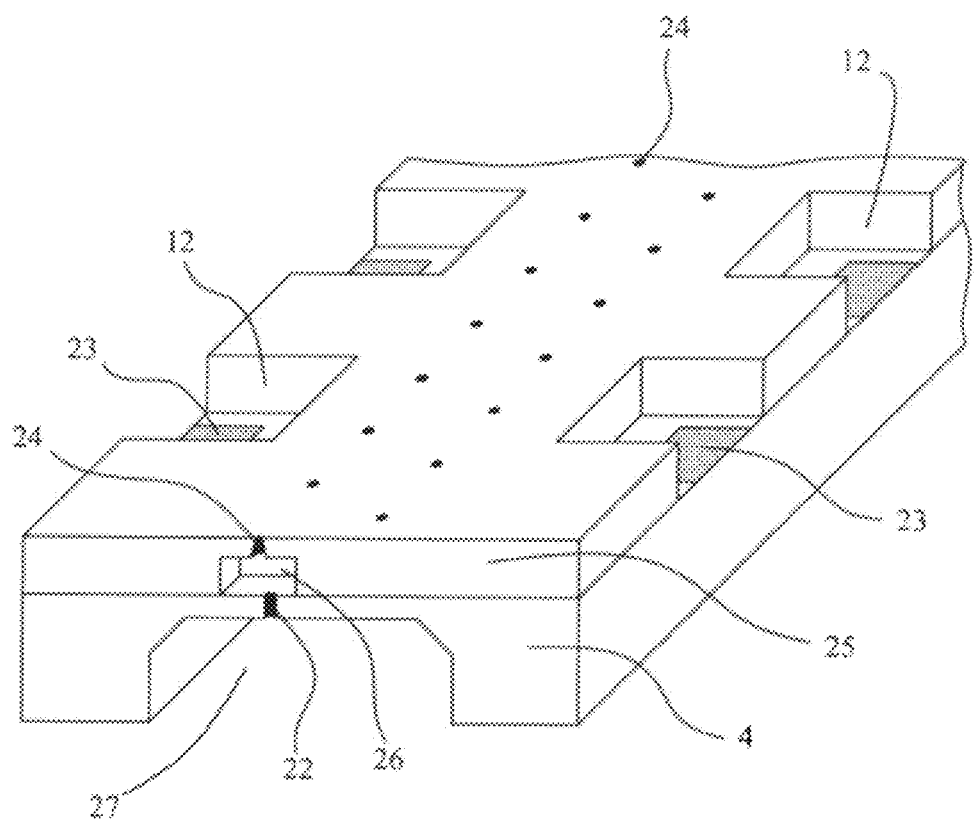
FIG. 1 represents in schematic form a monolithic ink jet printhead, seen in an axonometric projection and sectioned parallel to the x-z plane.
Figure 2:
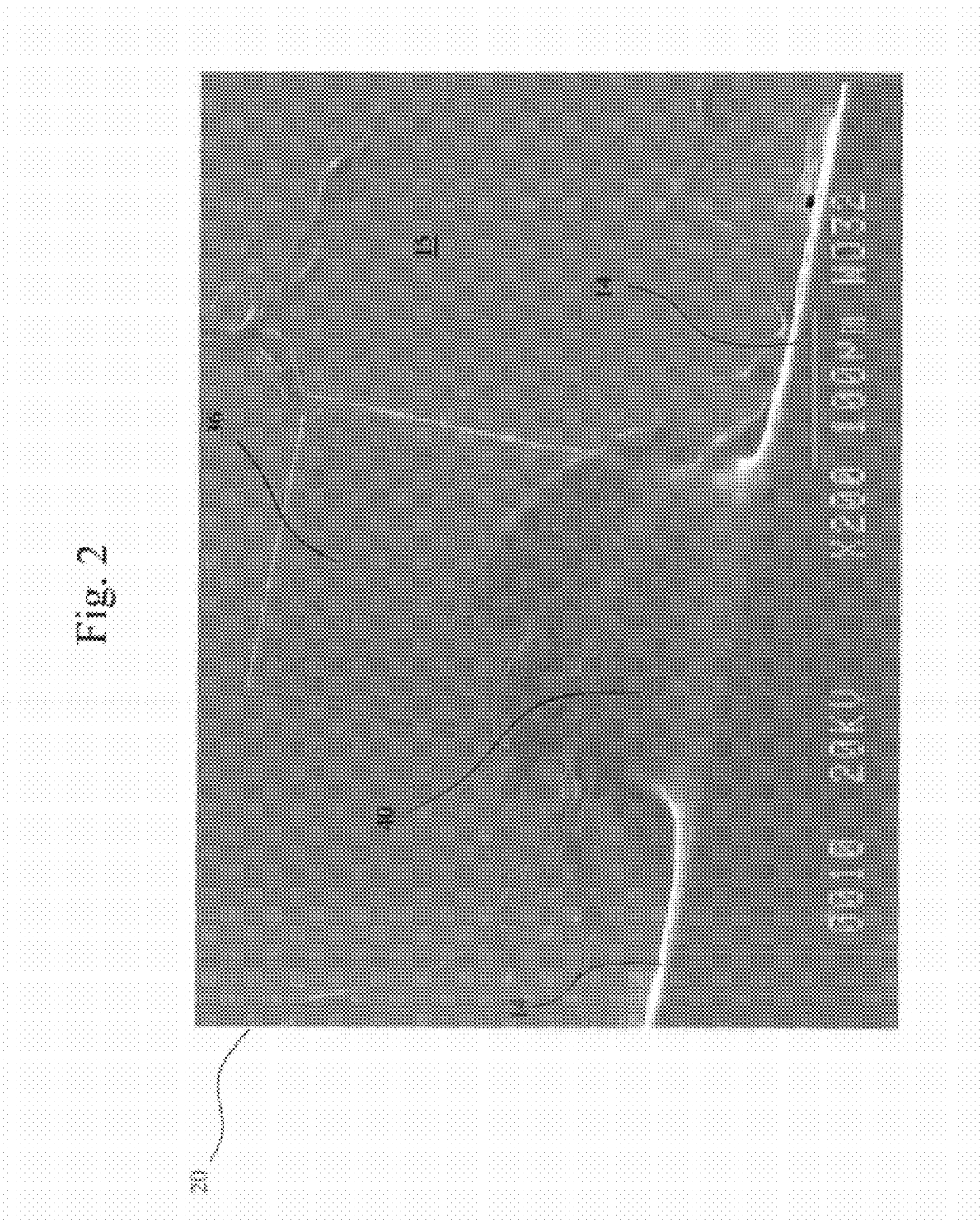
FIG. 2 is a microphotograph of a tridimensional structure made according to a method known in the prior art.

The product obtained from the mix and with the procedure described above demonstrated unacceptable definition characteristics and had ample polymeric residues in the areas covered by the mask during the exposure, as illustrated in the microphotograph of FIG. 2.

On observing the figure, local to the reflecting metallic part 36 the side wall 14 was seen to have an undesired deposit 40, indicating excessive polymerization caused by the acid species unduly generated by the reflection of the radiation, and not inhibited due to a lack of the specific additive.

EXAMPLE 2

Again this example was produced without addition of the basic additive.

The composition and preparation of the mix were identical to those defined in example 1, but the substrate with the mix deposited on it in this case was radiated with less energy than in example 1.

UV radiation produced by a mercury vapour lamp was used once again, with a suitable mask in between defining a pattern including two cavities, but this time radiating a total energy of 0.8 J/cm² on the specimen.

At the end of the exposure, the non-polymerized parts were removed by immersion for 3 minutes in a 1/1 p/p mix of xylene and methylisobutylchetone.

Definition of the pattern obtained and presence or otherwise of undesired residues was evaluated by observation under an electronic scanning microscope (SEM).

The product obtained from the mix and with the procedure described above still demonstrated unacceptable definition characteristics and still had polymeric residues in the areas covered by the mask during the exposure, as illustrated in the microphotograph of FIG. 7.

FIG. 7 shows a cavity 20-1 with two separate metallic coatings 5a and 5b (consisting of aluminium), adjacent to a structural layer 25 bounded by a side wall 14; as the figure shows, the metallic coating 5b extends under the structural layer 25, while the metallic coating 5a stops a few tens of microns from the wall 14 bounding the structural layer 25.

On observing the figure, local to the metallic coating 5b, which continues under the polymeric layer 25, the side wall 14 is seen to have an undesired deposit 40, indicating excessive polymerization. On the left of the FIG. 7, on the other hand, it may be seen that the wall 14 remains straight in correspondence with the metallic coating 5a.

It is considered that the excess of polymerization observed was caused by the acid species unduly generated by the reflection of the radiation of the reflecting surface of the metallic coating 5b, and not inhibited due to the lack of the specific additive, whereas this phenomenon did not occur in the adjacent portion of the polymeric layer, in the proximity of the metallic coating 5a, since the latter, as it did not continue under the exposed area, could not perform reflection. This demonstrates clearly that, under the experimental conditions described above, excessive polymerization occurred which extended for a few tens of μm in the areas concerned by reflection of the radiation whereas, in those areas where reflection did not occur, no visible presences were noted of polymerized residual material not removed by the development.

This leads us to believe that the excessive polymerization observed is not due to causes such as, for example, migration or diffusion of acid species into areas not exposed to radiation, or the presence of contaminants presents in the environment, which, in any case could involve, at most, thicknesses in the order of a few tens of nanometers, dimensions that cannot be observed on the scale of the elements in question.

EXAMPLE 3

To the mix obtained following the previous example a polymerization inhibitor basic additive was added, consisting of tris-(2-hydroxy-1-propyl)ammina in a stechiometric ratio of 1:3.8 to the photoinitiator.

The mix thus prepared was used under the same conditions as the process described in example 1, in which the radiated energy was suitably increased to take account of the lesser reactivity of the photopolymerizable layer. The value taken was of 3.5 J/cm².

Figure 8:
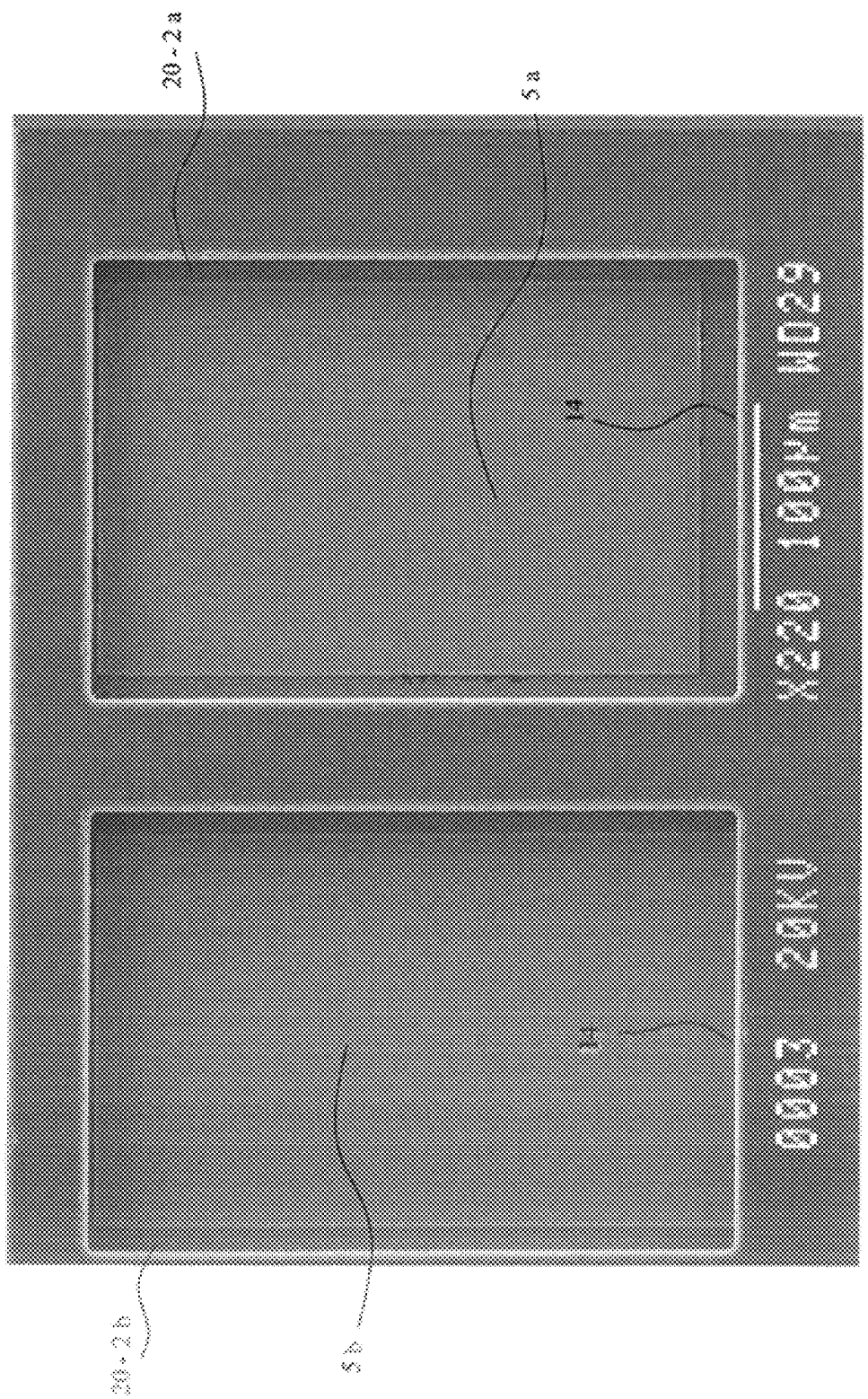
FIGS. 8, 9, 10 and 11 are microphotographs of tridimensional structures produced according to different examples of the process of this invention.

In this case, the results observed under the SEM, reproduced in FIG. 8, were excellent. No residues were observed in the masked areas and the side walls of the cavities were substantially vertical and joined with sharp edges to the bottom wall, even where the latter was highly reflecting.

The microphotograph of FIG. 8 shows in plan view two, rectangular shape cavities 20-2a and 20-2b, bearing on the bottom two metallic coatings 5a and respectively 5b, consisting of a layer of aluminium. In the right-hand cavity 20-2a the metallic coating 5a is away from the side wall 14 by a distance of a few tens of micron, whereas, in the left-hand cavity 20-2b, the metallic coating 5b continues under the side wall 14. In this microphotograph, the geometric regularity of side wall 14 in both cavities can be seen, without appreciable differences in correspondence with the metallic coating 5b.

EXAMPLE 4

A polymerization inhibitor basic additive consisting of tris-(2-hydroxy-1-propyl)ammina, in a stechiometric ratio of 1:7.5 to the photoinitiator, was added to the mix obtained following example 2.

The mix was subjected to the process described in example 2, taking care to appropriately increase the energy radiated, taking into account the reduced reactivity of the photopolymerizable layer. The value taken was of 1.2 J/cm².

Figure 9:
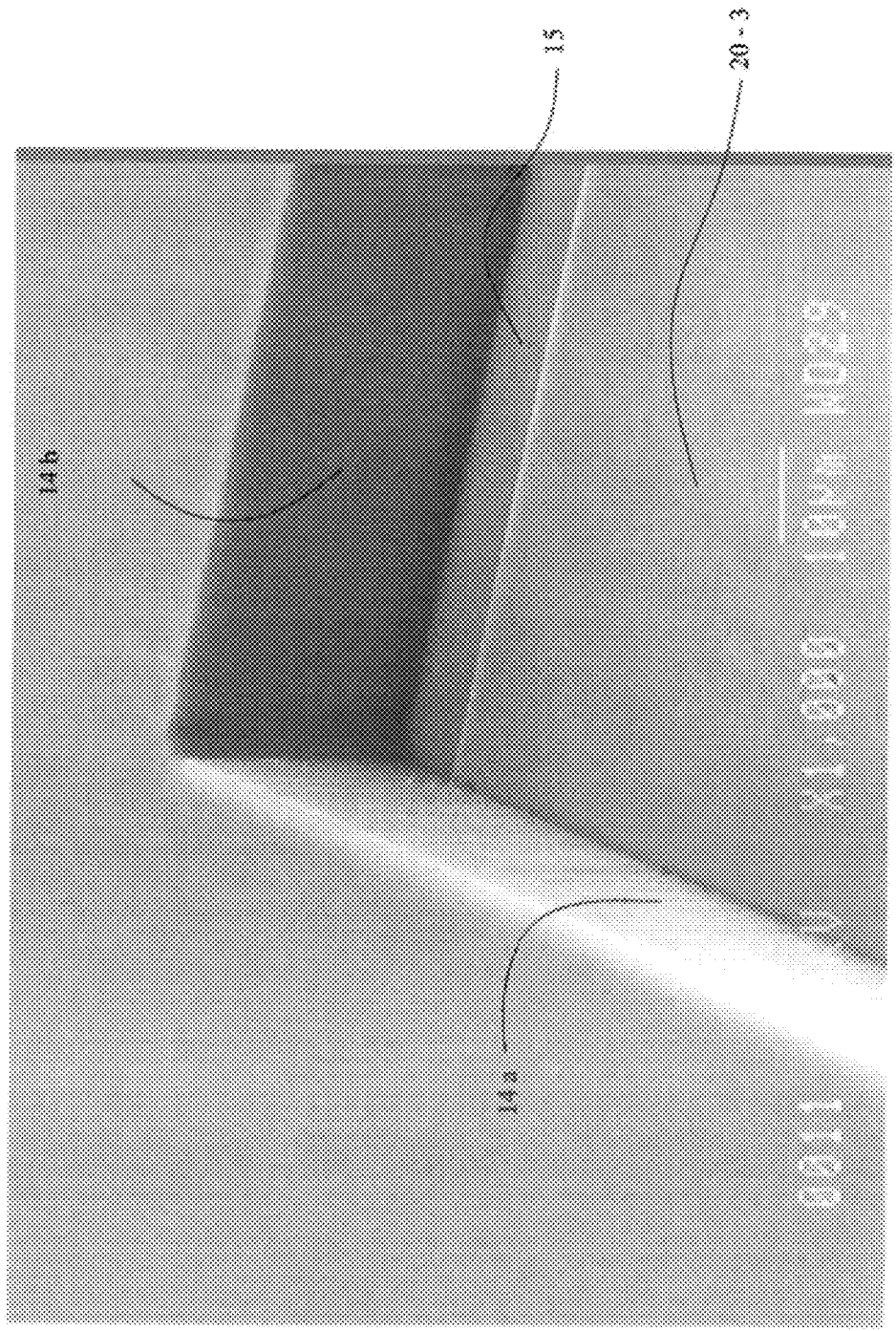

Again in this case, the results observed under the SEM, shown in FIG. 9, were excellent. No residues were observed in the masked areas and the side walls of the cavities were vertical and joined with sharp edges to the bottom wall, even where the latter was highly reflecting.

The microphotograph of FIG. 9 shows, with greater enlargement than the earlier FIGS. 7, 8, a perspective view of almost three quarters of the cavity 20-3 made in example 4, where the production of the two adjacent walls 14a and 14b can be seen clearly, which are joined to the bottom wall 15 with a sharp edge and at right angles. In addition the walls 14a and 14b show a substantially flat surface, without any significant imperfections, as also does the bottom wall 15.

EXAMPLE 5

A polymerization inhibitor basic additive was added, consisting of piperidine, in a stechiometric ratio of 1:5 to the photoinitiator was added to the mix obtained following example 2.

The mix was subjected to the process described in example 2, taking care to appropriately increase the energy radiated taking into account the reduced reactivity of the photopolymerizable layer. The value taken was of 1.8 J/cm$^2$.

Observation under the SEM (FIG. 10) revealed that there were no residues in the masked areas and that the side walls of the cavities were vertical and joined substantially with a sharp edge to the bottom wall, even where the latter was highly reflecting.

Figure 10:
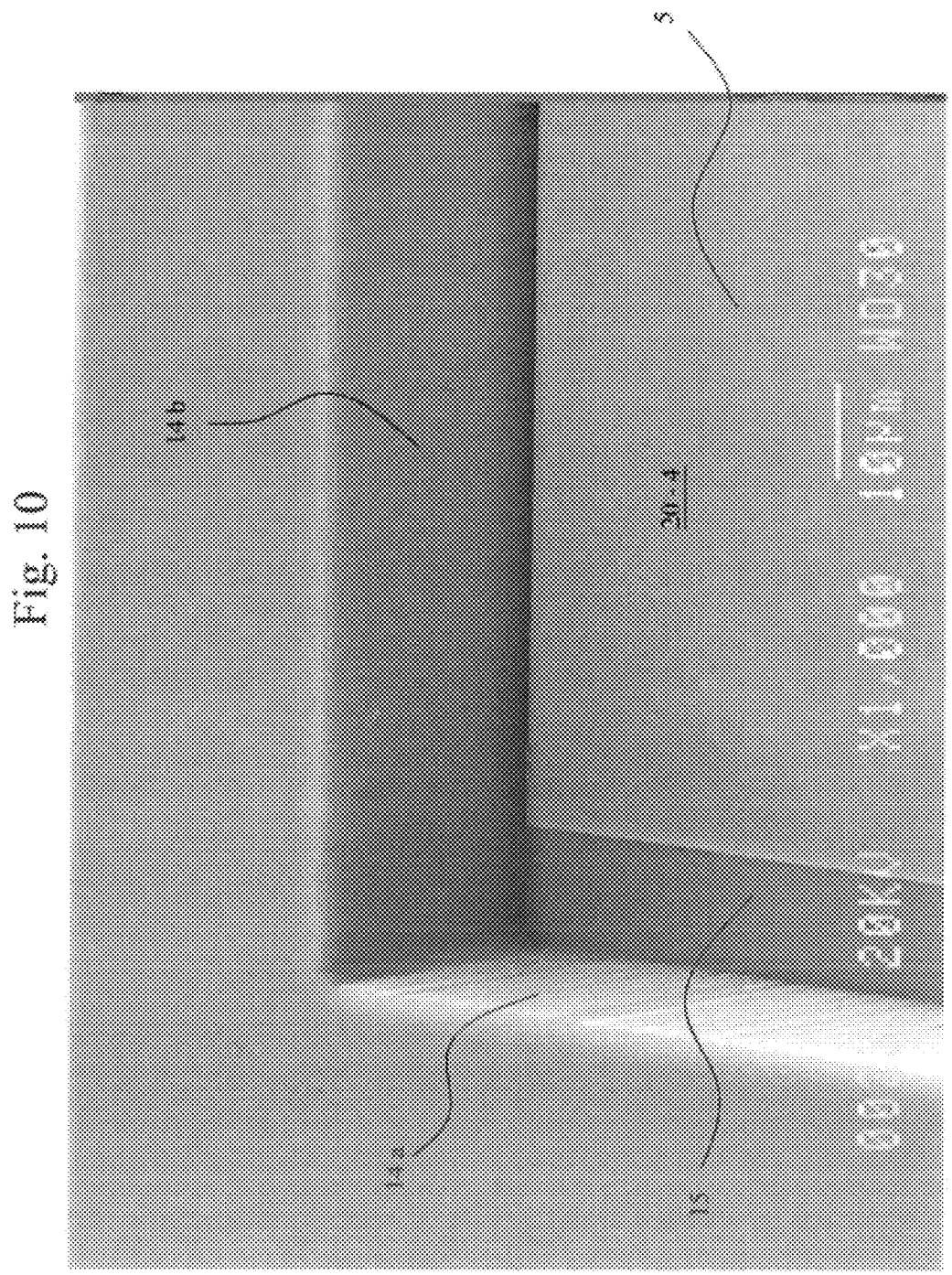

The microphotograph of FIG. 10 shows a perspective view of the cavity 20-4 made in example 5, where the geometric regularity of the side walls is apparent and in particular the substantial absence of defects in the area in which the metallic coating 5 extends under the wall 14b.

EXAMPLE 6

A polymerization inhibitor basic additive was added, consisting of 4-dimethylamminopiridine, in a stechiometric ratio of 1:4 to the photoinitiator was added to the mix obtained following example 2.

The mix was subjected to the process described in example 2, taking care to appropriately increase the energy radiated taking into account the reduced reactivity of the photopolymerizable layer. The value taken was of 2.5 J/cm$^2$.

Observation under the SEM (FIG. 11) revealed that there were no residues in the masked areas and that the side walls of the cavities were substantially vertical and with a sharp edge to the bottom wall, even where the latter was highly reflecting.

Figure 11:
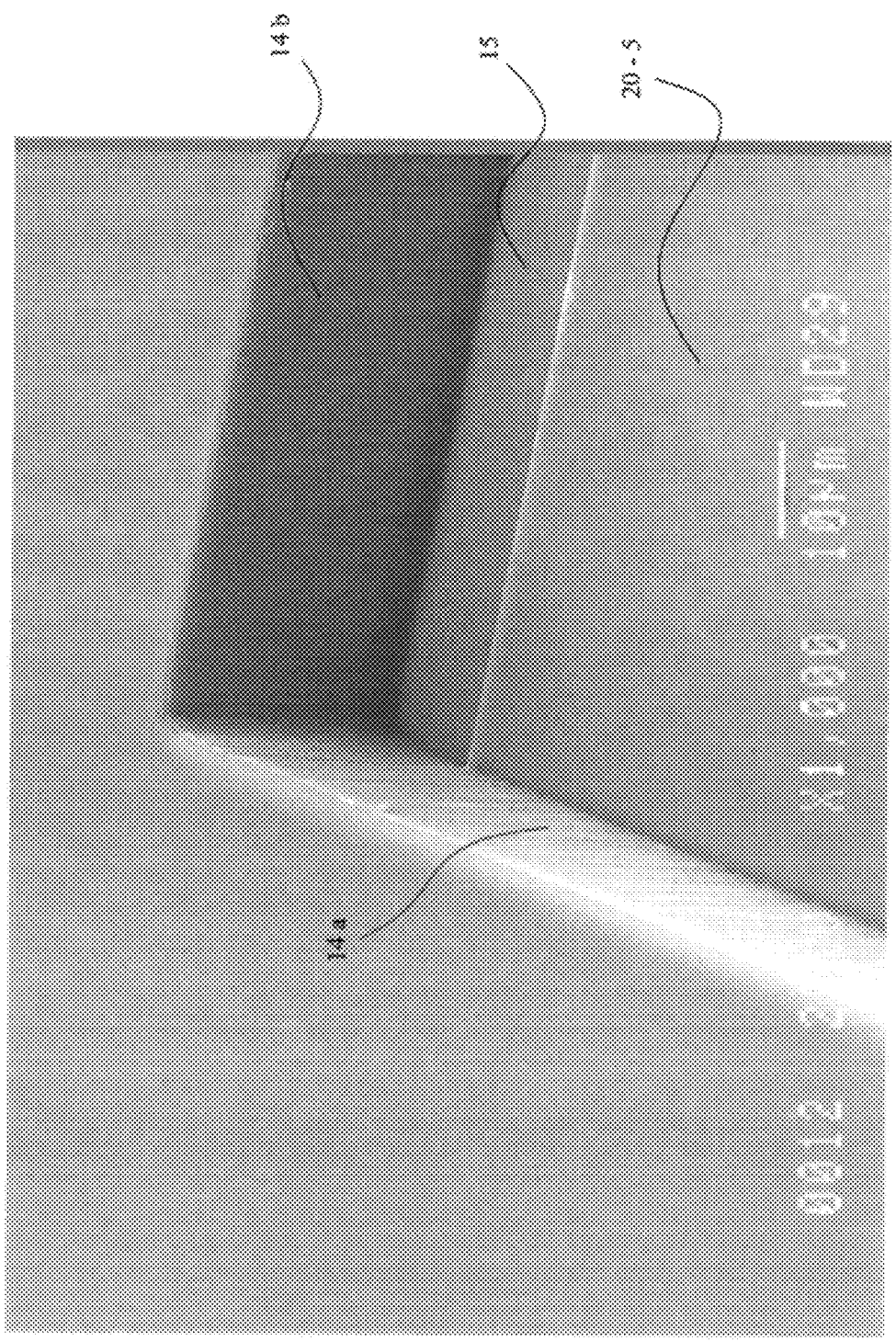

The microphotograph of FIG. 11 shows a perspective view of the cavity 20-5, where the production of the two adjacent walls 14a and 14b can be seen clearly, joined to the bottom wall 15 with a sharp edge and at right angles. In addition the walls 14a and 14b show a substantially flat surface, without any significant imperfections, as also does the bottom wall 15.

The above description relates to a method for producing tridimensional structures in a structural layer, obtained from the polymerization of negative type photopolymers, which polymerize in the areas struck by radiation and remain soluble, and therefore removable by means of a solvent, in the areas in shadow.

However the method according to this invention also applies to positive type photopolymers, which, initially polymerized, become soluble in the areas struck by radiation, and therefore removable by means of a solvent in the radiated areas. In these photopolymers, if used on substrates of the type described earlier, defects could occur, occasioned by reflection phenomena. In the positive photopolymers, in the absence of the basic inhibitor compound, the radiation reflected under the mask would produce an undue solubilization, which would take the form of undesired voids in the structural layer obtained.

The invention claimed is:

1. A photolithographic process for producing tridimensional structures in a structural layer in photopolymer for an ink jet printhead, said tridimensional structures being made on a substrate having a bottom wall at least in part reflecting, and comprising at least a side wall adjacent to said bottom wall, said process comprising:
    depositing on said substrate a photopolymerizable layer comprising a solution of a monomer or oligomer, a photoinitiator, and a polymerization inhibitor basic compound in a quantity less than the stoichiometric value corresponding to the complete neutralization of the acid species generated by the photoinitiator;
    masking said layer for defining areas protected by said masking and areas not protected by said masking, intended to make said tridimensional structures;
    irradiating with an ultraviolet (UV) radiation for generating acid species suitable for promoting the polymerization of said solution in said areas not protected by said masking;
    in which a fraction of said radiation is reflected by said reflecting part on the inside of said areas protected by the masking, unwanted acid species being generated in a quantity corresponding to said fraction of radiation, on account of said reflected radiation;
    neutralizing said unwanted acid species by means of said inhibitor basic compound;
    removing said unpolymerized photopolymerizable solution from said areas protected by said masking.

2. A process according to claim 1, wherein said polymerization inhibitor is chosen from among: N,N-dimethylaniline; piridine; hydroxylamina; 2,6-dimethylpyridine; 4-dimethylamminopyridine; imidazole; morpholine; hydrazine; piperidine; triisopropanolammine; methylamine; ethylamine; diethylamine; triethylamine.

3. A process according to claim 1, wherein said polymerization inhibitor comprises piperidine.

4. A process according to claim 1, wherein said polymerization inhibitor comprises 4-dimethylamminopyridine.

5. A process according to claim 1, wherein said polymerization inhibitor is present in said polymerizable solution in a concentration between 0.05% and 0.4% by weight, with respect to the weight of said polymerizable solution, excluding said solvent.

6. A process according to claim 1, in which the stoichiometric ratio of said polymerization inhibitor to said photoinitiator is between 1:10 and 9:10.

7. A process according to claim 1, in which the stoichiometric ratio of said polymerization inhibitor to said photoinitiator is between 1:8 and 3:8.

8. A process according to claim 1, in which said reflecting part consists of a track of aluminium.

9. A process according to claim 1, in which said tridimensional structures comprise at least one cavity of at least 20 μm side, having a bottom wall that comprises a reflecting portion.

10. A process according to claim 1, in which said tridimensional structures have a thickness of at least 5 μm.

11. A photolithographic process for producing tridimensional structures in a structural layer in photopolymer for an ink jet printhead, said tridimensional structures being made on a substrate having a bottom wall at least in part reflecting, and comprising at least a side wall adjacent to said bottom wall, said process comprising:
    depositing on said substrate a photopolymerizable layer comprising a solution of a monomer or oligomer, a photoinitiator, and a polymerization inhibitor basic compound in a quantity less than the stoichiometric value corresponding to the complete neutralization of the acid species generated by the photoinitiator, wherein said polymerization inhibitor comprises tris-(2-hydroxy-1-propyl)amine;
    masking said layer for defining areas protected by said masking and areas not protected by said masking, intended to make said tridimensional structures;

irradiating with an ultraviolet (UV) radiation for generating acid species suitable for promoting the polymerization of said solution in said areas not protected by said masking;

in which a fraction of said radiation is reflected by said reflecting part on the inside of said areas protected by the masking, unwanted acid species being generated in a quantity corresponding to said fraction of radiation, on account of said reflected radiation;

neutralizing said unwanted acid species by means of said inhibitor basic compound;

removing said unpolymerized photopolymerizable solution from said areas protected by said masking.

12. A photolithographic process for producing tridimensional structures in a structural layer in photopolymer for an ink jet printhead, said tridimensional structures being made on a substrate having a bottom wall at least in part reflecting, and comprising at least a side wall adjacent to said bottom wall, said process comprising:

depositing on said substrate a photopolymerizable layer comprising a solution of a monomer or oligomer, a photoinitiator, and a polymerization inhibitor basic compound in a quantity less than the stoichiometric value corresponding to the complete neutralization of the acid species generated by the photoinitiator, wherein said polymerization inhibitor has a coefficient of acidity of the conjugate acid (pKa) that is between 5 and 11;

masking said layer for defining areas protected by said masking and areas not protected by said masking, intended to make said tridimensional structures;

irradiating with an ultraviolet (UV) radiation for generating acid species suitable for promoting the polymerization of said solution in said areas not protected by said masking;

in which a fraction of said radiation is reflected by said reflecting part on the inside of said areas protected by the masking, unwanted acid species being generated in a quantity corresponding to said fraction of radiation, on account of said reflected radiation;

neutralizing said unwanted acid species by means of said inhibitor basic compound;

removing said unpolymerized photopolymerizable solution from said areas protected by said masking.

* * * * *